(12) United States Patent
Nakatogawa

(10) Patent No.: US 12,495,698 B2
(45) Date of Patent: Dec. 9, 2025

(54) ELECTRONIC APPARATUS AND DISPLAY DEVICE

(71) Applicant: Magnolia White Corporation, Tokyo (JP)

(72) Inventor: Hirondo Nakatogawa, Tokyo (JP)

(73) Assignee: Magnolia White Corporation, Tokyo (JP)

(*) Notice: Subject to any disclaimer, the term of this patent is extended or adjusted under 35 U.S.C. 154(b) by 399 days.

(21) Appl. No.: 18/318,019

(22) Filed: May 16, 2023

(65) Prior Publication Data

US 2023/0380243 A1   Nov. 23, 2023

(30) Foreign Application Priority Data

May 19, 2022   (JP) ................................. 2022-082286

(51) Int. Cl.
*G09G 3/32* (2016.01)
*H10K 59/35* (2023.01)
*H10K 59/65* (2023.01)

(52) U.S. Cl.
CPC ........... *H10K 59/65* (2023.02); *H10K 59/352* (2023.02); *H10K 59/353* (2023.02)

(58) Field of Classification Search
CPC .... H10K 59/121; H10K 59/353; H10K 59/60; H10K 2102/102; H10K 2102/103; H10K 59/65; H10K 59/352; H10K 59/351; G09G 2300/0426; G09G 2300/0452; G09G 3/3225; G09F 9/35; G09F 9/33
See application file for complete search history.

(56) References Cited

U.S. PATENT DOCUMENTS

| | | | |
|---|---|---|---|
| 2020/0052048 A1* | 2/2020 | Kuo | G06F 1/1605 |
| 2021/0013272 A1 | 1/2021 | Zhang et al. | |
| 2021/0013298 A1* | 1/2021 | Her | H10K 59/353 |
| 2021/0376011 A1* | 12/2021 | Liu | H10K 59/353 |
| 2022/0199874 A1* | 6/2022 | Ko | G09F 9/3026 |
| 2022/0285473 A1* | 9/2022 | Yu | G09G 3/3225 |

* cited by examiner

*Primary Examiner* — Pegeman Karimi
(74) *Attorney, Agent, or Firm* — Michael Best & Friedrich LLP

(57) ABSTRACT

According to one embodiment, an electronic apparatus includes a display panel on which a first pixel including a first light emitting element which emits light of a first color, a second pixel including a second light emitting element which emits light of a second color, and a third pixel including a third light emitting element which emits light of a third color are arranged, and an imaging device receiving light through the display panel. At least one of the first to third pixels which overlap with the imaging device in planar view is arranged with an interval different from an interval of the first to third pixels which do not overlap with the imaging device in planar view.

9 Claims, 13 Drawing Sheets

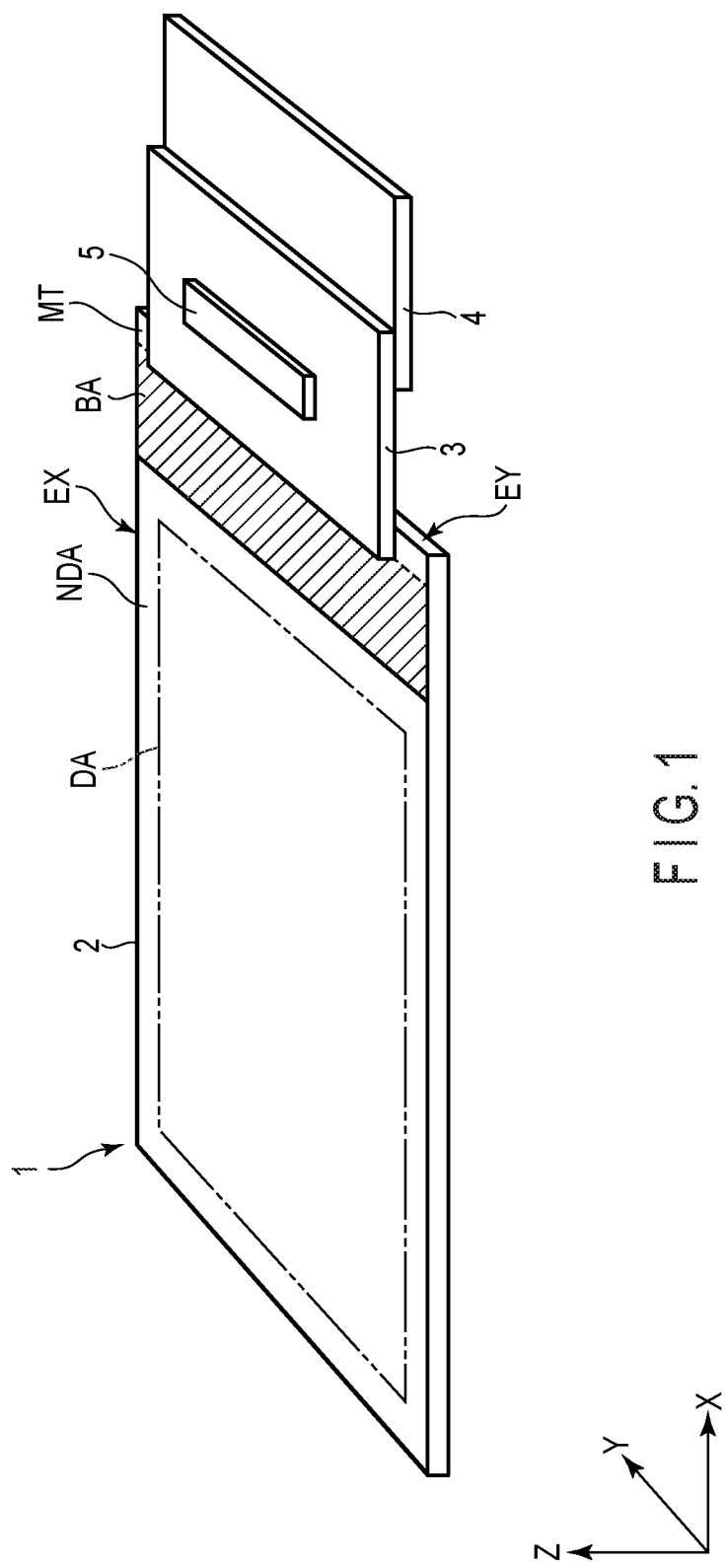
F I G. 1

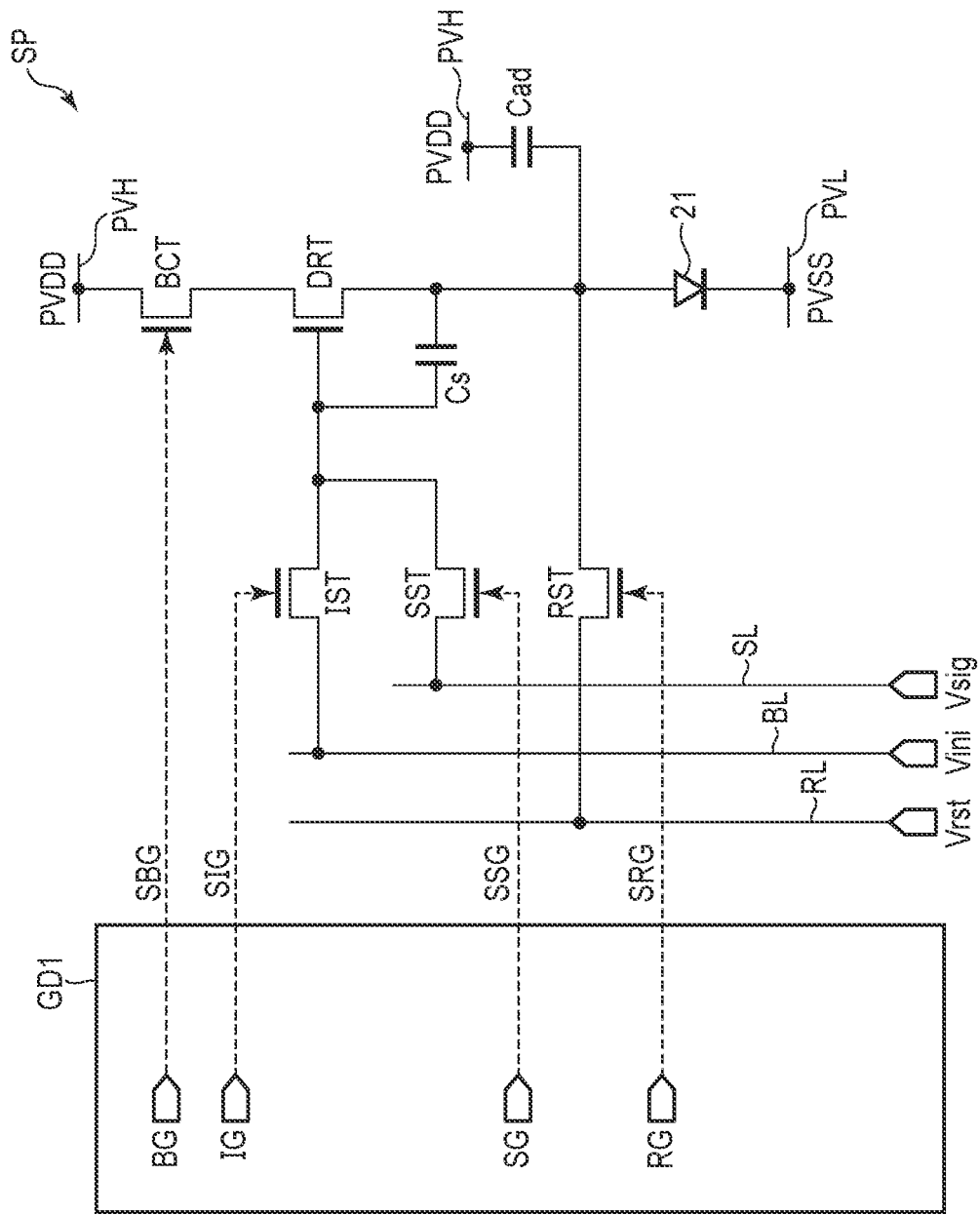
F I G. 4

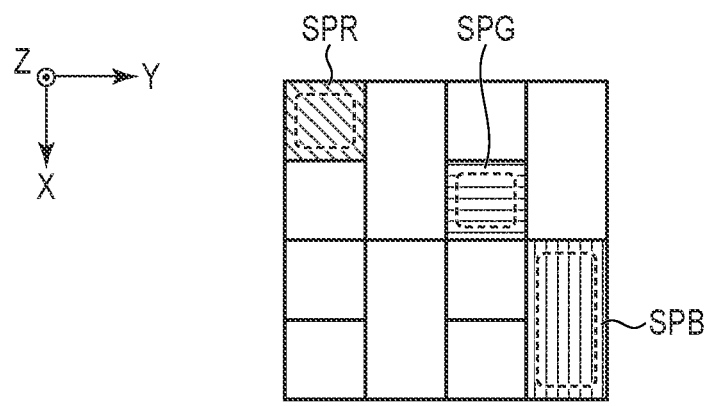
F I G. 20

ELECTRONIC APPARATUS AND DISPLAY DEVICE

CROSS-REFERENCE TO RELATED APPLICATIONS

This application is based upon and claims the benefit of priority from Japanese Patent Application No. 2022-082286, filed May 19, 2022, the entire contents of which are incorporated herein by reference.

FIELD

Embodiments described herein relate generally to an electronic apparatus and a display device.

BACKGROUND

In recent years, electronic apparatuses such as smartphones equipped with a display device and a camera on the same side have been widely put to practical use. In addition, display devices including organic electroluminescent (EL) elements (hereinafter referred to as organic EL display devices) are often used as display devices provided in such electronic apparatuses.

The above-described electronic apparatus is configured such that a camera is arranged on a back side of the organic EL display device (display area) and that an imaging device provided in the camera can receive light via the organic EL display device, and the display area can be extended to an area overlapping with the camera.

By the way, in an organic EL display device, various images can be displayed in the display area by emitting light from the organic EL element of each pixel, but the display quality may be deteriorated in the display area overlapping with the above camera (imaging device).

BRIEF DESCRIPTION OF THE DRAWINGS

FIG. 1 is a perspective view schematically showing a configuration of a display device of a first embodiment.

FIG. 4 is a view showing an example of a circuit configuration of a sub-pixel included in a pixel.

FIG. 20 is a view schematically showing yet another example of the arrangement of the sub-pixels in the present embodiment.

DETAILED DESCRIPTION

Figure 2:
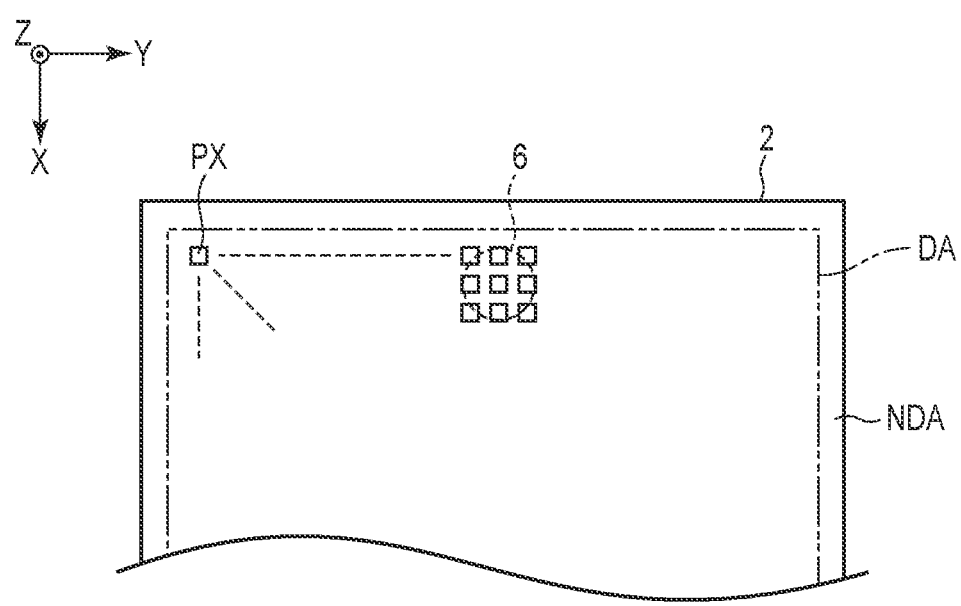
FIG. 2 is a plan view showing parts of an electronic apparatus in which the display device is incorporated.

In general, according to one embodiment, an electronic apparatus includes a display panel on which a first pixel including a first light emitting element which emits light of a first color, a second pixel including a second light emitting element which emits light of a second color, and a third pixel including a third light emitting element which emits light of a third color are arranged, and an imaging device receiving light through the display panel. At least one of the first to third pixels which overlap with the imaging device in planar view is arranged with an interval different from an interval of the first to third pixels which do not overlap with the imaging device in planar view.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

First Embodiment

FIG. 1 is a perspective view schematically showing a configuration of a display device 1 of a first embodiment. FIG. 1 shows a three-dimensional space which is defined by a direction X, a direction Y orthogonal to the direction X, and a direction Z orthogonal to the direction X and the direction Y. The direction X, the direction Y, and the direction Z are orthogonal to each other, but may intersect at an angle other than 90 degrees. In addition, the direction Z is defined as an upper or upward direction while a direction opposite to the direction Z is defined as a lower or downward direction, in the present embodiment. According to "a second member above/on a first member" and "a second member below/under a first member", the second member may be in contact with the first member or may be remote from the first member.

In the present embodiment, an example that the display device 1 is an organic EL display device (organic EL display) including organic electroluminescent (EL) elements which are self-luminous elements will be described below. The display device 1 of the present embodiment is built in an electronic apparatus such as a smartphone and used together with, for example, other devices such as a camera.

As shown in FIG. 1, the display device 1 includes a display panel 2, a first circuit board 3, a second circuit board 4, and the like.

The display panel 2 has, for example, a rectangular shape. In the example illustrated, long sides EX of the display panel 2 are parallel to the direction X, and short sides EY of the display panel 2 are parallel to the direction Y. The direction Z corresponds to a thickness direction of the display panel 2. A main surface of the display panel 2 is parallel to an X-Y plane defined by the direction X and the direction Y. The display panel 2 includes a display area DA, and a non-display area NDA and a terminal area MT which are located outside the display area DA. In the example illustrated, the non-display area NDA surrounds the display area DA.

The terminal area MT is provided along the short sides EX of the display panel 2, and includes terminals for electrically connecting the display panel 2 to an external device or the like.

The first circuit board 3 is mounted on the terminal area MT and is electrically connected to the display panel 2. The first circuit board 3 is, for example, a flexible printed circuit. The first circuit board 3 includes a drive IC chip (drive circuit) 5 that drives the display panel 2 (display device 1), and the like. In the example illustrated, the driver IC chip 5 is arranged on the first circuit board 3, but may be arranged under the first circuit board 3. The second circuit board 4 is connected to the first circuit board 3, for example, at a position under the first circuit board 3.

For example, the driver IC chip 5 is connected to a control board (not shown) via the second circuit board 4. The drive IC chip 5 executes control to display images on the display panel 2 by urging the organic EL elements of the display panel 2 to emit light, based on, for example, image data (pixel signals) output from the control substrate.

The display panel 2 may include a fold area BA represented by oblique lines in FIG. 1. The fold area BA is an area which is bent when the display device 1 is accommodated in a housing of an electronic apparatus. In a state in which the fold area BA is folded, the first circuit board 3 and the second circuit board 4 are arranged under the display panel 2 so as to be opposed to the display panel 2.

FIG. 2 is a plan view showing parts of the electronic apparatus in which the display device 1 shown in FIG. 1 is incorporated. As shown in FIG. 2, the display panel 2 of the display device 1 includes a plurality of pixels PX arranged (arrayed) in a matrix in the direction X and the direction Y, in the display area DA.

In the present embodiment, each pixel PX arranged in the display area DA has an organic EL element, a pixel circuit for driving the organic EL element, and the like, which will be described below.

In the present embodiment, it is assumed that the display panel 2 (display device 1) has a display surface including the display area DA and a back surface opposed to the display surface, and that a camera 6 including an image sensor which receives light through the display panel 2 is arranged on the back side of the display panel 2. It is assumed that the camera 6 in the present embodiment is an imaging device (visible light camera) which captures color images, based on visible light made incident on the imaging elements. In the present embodiment, the display device 1 and the camera 6 constitute, for example, an electronic apparatus such as a smartphone.

In the electronic apparatus of the present embodiment, the camera 6 is arranged in a position which overlaps with the display area DA. In other words, the camera 6 is arranged to stretch over a plurality of pixels PX (i.e., overlap with a plurality of pixels PX) in planar view. According to this configuration, the display area DA in the electronic apparatus (display device 1) can be expanded to the area which overlaps with camera 6. In the present embodiment, planar view means viewing the display device 1 (display panel 2) from the direction Z.

Figure 3:
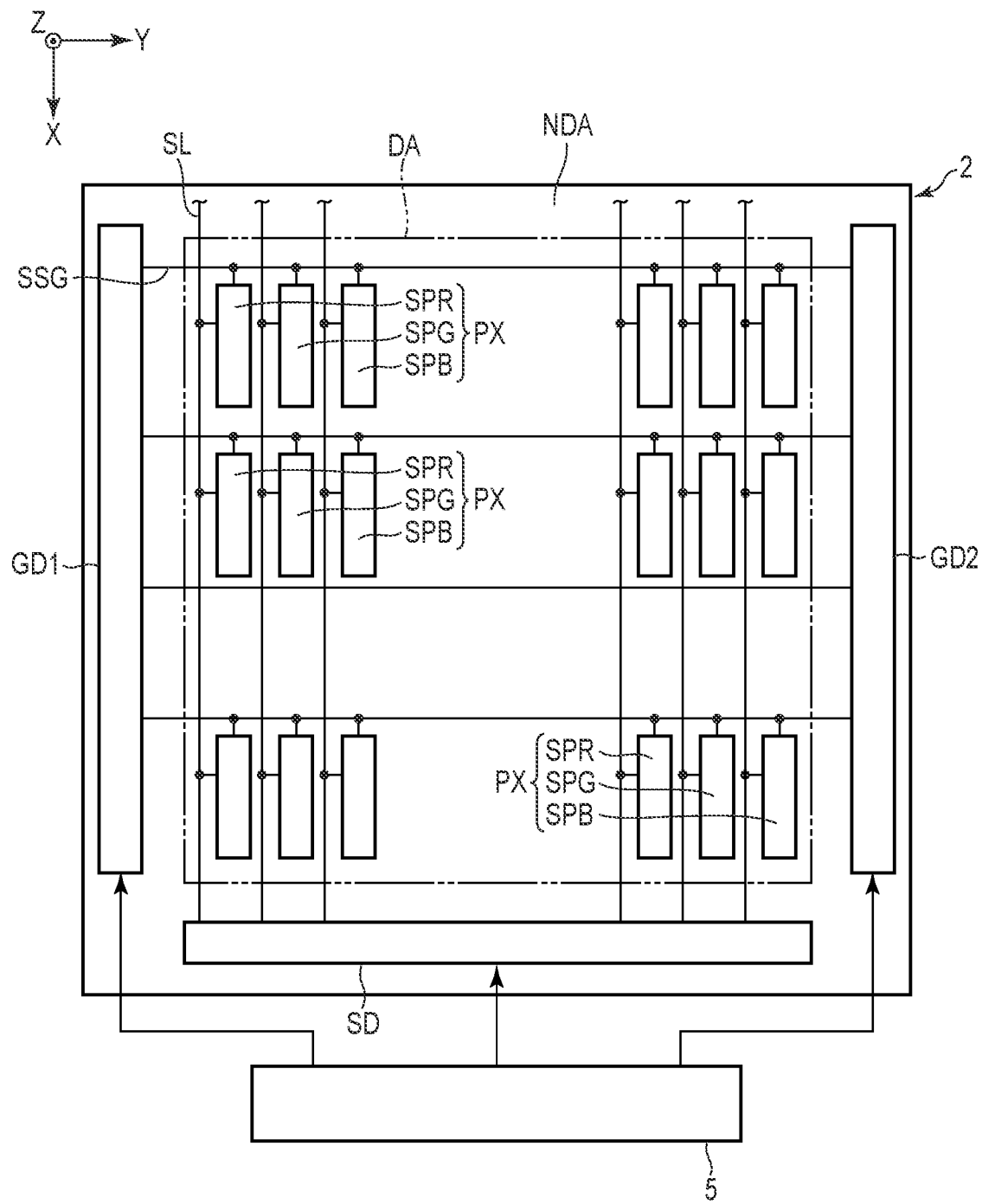
FIG. 3 is a view showing an example of a circuit configuration of a display panel.

FIG. 3 is a view showing an example of a circuit configuration of the display panel 2. A plurality of pixels PX, various lines, scanning line drive circuits GD1 and GD2, and a signal line drive circuit SD are arranged on the display panel 2.

The plurality of pixels PX are arranged in a matrix in the display area DA as described above and each of the pixels includes a plurality of sub-pixels. In the present embodiment, the plurality of sub-pixels include sub-pixels SPR, SPG and SPB. The sub-pixel SPR is a pixel which displays (outputs) light corresponding to a red wavelength range (light of a red component). The sub-pixel SPG is a pixel which displays (outputs) light corresponding to a green wavelength range (light of a green component). The sub-pixel SPB is a pixel which displays (outputs) light corresponding to a blue wavelength range (light of a blue component).

The various lines described above extend in the display area DA and are drawn to the non-display area NDA. In FIG. 3, a plurality of control lines (scanning lines) SSG and a plurality of pixel signal lines SL are exemplified as parts of the various lines.

In the display area DA, the control lines SSG and the pixel signal lines SL are connected to the sub-pixels SPR, SPG and SPB. The control lines SSG are connected to the scanning line drive circuits GD1 and GD2 in the non-display area NDA. The pixel signal lines SL are connected to the signal line drive circuit SD in the non-display area NDA.

The scanning line drive circuits GD1 and GD2 and the signal line drive circuit SD are located in the non-display area NDA. The scanning line drive circuits GD1 and GD2 and the signal line drive circuit SD are provided with various signals and voltages from the driver IC chip 5.

FIG. 3 shows a configuration that the display panel 2 includes two scanning line drive circuits GD1 and GD2, but the display panel 2 needs only to include at least one scanning line drive circuit.

Next, an example of a circuit configuration of the sub-pixel included in the pixel PX will be described with reference to FIG. 4. In FIG. 4, the circuit configuration of one sub-pixel SP among the plurality of sub-pixels included in the pixel PX is shown for convenience.

As shown in FIG. 4, the sub-pixel SP includes an organic EL element 21 and a pixel circuit. The pixel circuit includes a drive transistor DRT, an output transistor BCT, a pixel transistor SST, an initializing transistor IST, a reset transistor RST, a storage capacitance Cs, and an auxiliary capacitance Cad.

Each transistor shown in FIG. 4 is, for example, an n-channel transistor. Each of the output transistor BCT, the pixel transistor SST, the initializing transistor IST, and the reset transistor RST may not be constituted by a transistor, and the transistors may be configured to function as, for example, an output switch, a pixel switch, an initializing switch, and a reset switch.

In the following descriptions, one of a source electrode and a drain electrode of the transistor is referred to as a first electrode, and the other is referred to as a second electrode. In addition, one of electrodes of the capacitive element is referred to as a first electrode, and the other is referred to as a second electrode.

The drive transistor DRT and the organic EL element 21 are connected in series between a first power line PVH and a second power line PVL. The first power line PVH is held at a constant potential, and the second power line PVL is held at a constant potential different from the electric potential of the first power line PVH. In the present embodiment, the electric potential PVDD of the first power line PVH is higher than the electric potential PVSS of the second power line PVL.

The first electrode of the drive transistor DRT is connected to an anode electrode (anode) of the organic EL element, a first electrode of the holding capacitance Cs, and a first electrode of the auxiliary capacitance Cad. The drive transistor DRT is configured to control the current (current value) supplied to the organic EL element 21.

A second electrode of the output transistor BCT is connected to the first power line PVH. In addition, a cathode electrode (cathode) of the organic EL element 21 is connected to the second power line PVL.

A first electrode of the pixel transistor SST is connected to a gate electrode of the drive transistor DRT, a first electrode of the initializing transistor IST, and a second electrode of the storage capacitance Cs. A second electrode of the pixel transistor SST is connected to the pixel signal line SL. A second electrode of the initializing transistor IST is connected to an initializing power line BL.

The storage capacitance Cs is electrically connected between the gate electrode and the first electrode of the drive transistor DRT.

The second electrode of the auxiliary capacitance Cad is held at a constant potential. In the present embodiment, for example, the second electrode of the auxiliary capacitance Cad is connected to the first power line PVH and is held at the same constant potential (PVDD) as the electric potential of the first power line PVH. The second electrode of the auxiliary capacitance Cad may be held at the same constant potential (PVSS) as the electric potential of the second power line PVL or held at the same constant potential as an electric potential of a power line different from the first power line PVH and the second power line PVL. As for the power line different from the first power line PVH and the second power line PVL, for example, the initializing power line BL, the reset power line RL, or the like can be used.

A first electrode of the reset transistor RST is connected to a first electrode of the drive transistor DRT. A second electrode of the reset transistor RST is connected to the reset power line RL.

A pixel signal Vsig is supplied to the pixel signal line SL. The pixel signal Vsig is a signal written to the pixel (sub-pixel SP in this example). An initializing potential Vini is supplied to the initializing power line BL.

The reset power line RL is set to the reset power potential Vrst. As for the reset power potential Vrst, an electric potential having a potential difference which does not urge the organic EL element 21 to emit light from the electric potential PVSS of the second power line PVL is supplied.

The gate electrode of the output transistor BCT is connected to a control line SBG. An output control signal BG is supplied to the control line SBG.

A gate electrode of the pixel transistor SST is connected to the control line SSG. A pixel control signal SG is supplied to the control line SSG.

A gate electrode of the initializing transistor IST is connected to a control line SIG. An initialization control signal IG is supplied to the control line SIG.

A gate electrode of the reset transistor RST is connected to a control line SRG. A reset control signal RG is supplied to the control line SRG.

According to the circuit configuration described above, the pixel transistor SST becomes conductive according to the pixel control signal SG supplied to the gate electrode via the control line SSG. As a result, the pixel signal Vsig supplied via the pixel signal line SL is supplied to the gate electrode of the drive transistor DRT via the pixel transistor SST and is held in the holding capacitance Cs. The drive transistor DRT can drive the organic EL element 21 with a current by supplying a drive current of a current value corresponding to the voltage value of the pixel signal Vsig held in the holding capacitance Cs, thereby causing the organic EL element 21 to emit light (driving the sub-pixel SP).

The outline of the writing operation of the pixel signal Vsig and the emitting operation of the organic EL element 21 in the display panel 2 has been briefly described, but other operations (for example, a reset operation and an offset cancellation operation of the drive transistor DRT) can also be executed according to the above-described circuit configuration.

In addition, the circuit configuration of one sub-pixel SP has been described, but the sub-pixels SPR, SPG, and SPB described above have the same circuit configuration as the sub-pixel SP shown in FIG. 4. In other words, in the present embodiment, the organic EL element 21 and the pixel circuit are arranged in each of the sub-pixels.

The circuit configuration described with reference to FIG. 4 is an example, and the sub-pixels SPR, SPG and SPB may have other circuit configurations different from the circuit configuration in FIG. 4. In other words, in the sub-pixels SPR, SPG, and SPB, for example, several parts of the circuit configuration shown in FIG. 4 may be changed or omitted, or other configurations may be added.

When the circuit configuration of the sub-pixels SPR, SPG and SPB is described below, FIG. 4 will be used as appropriate.

Figure 5:
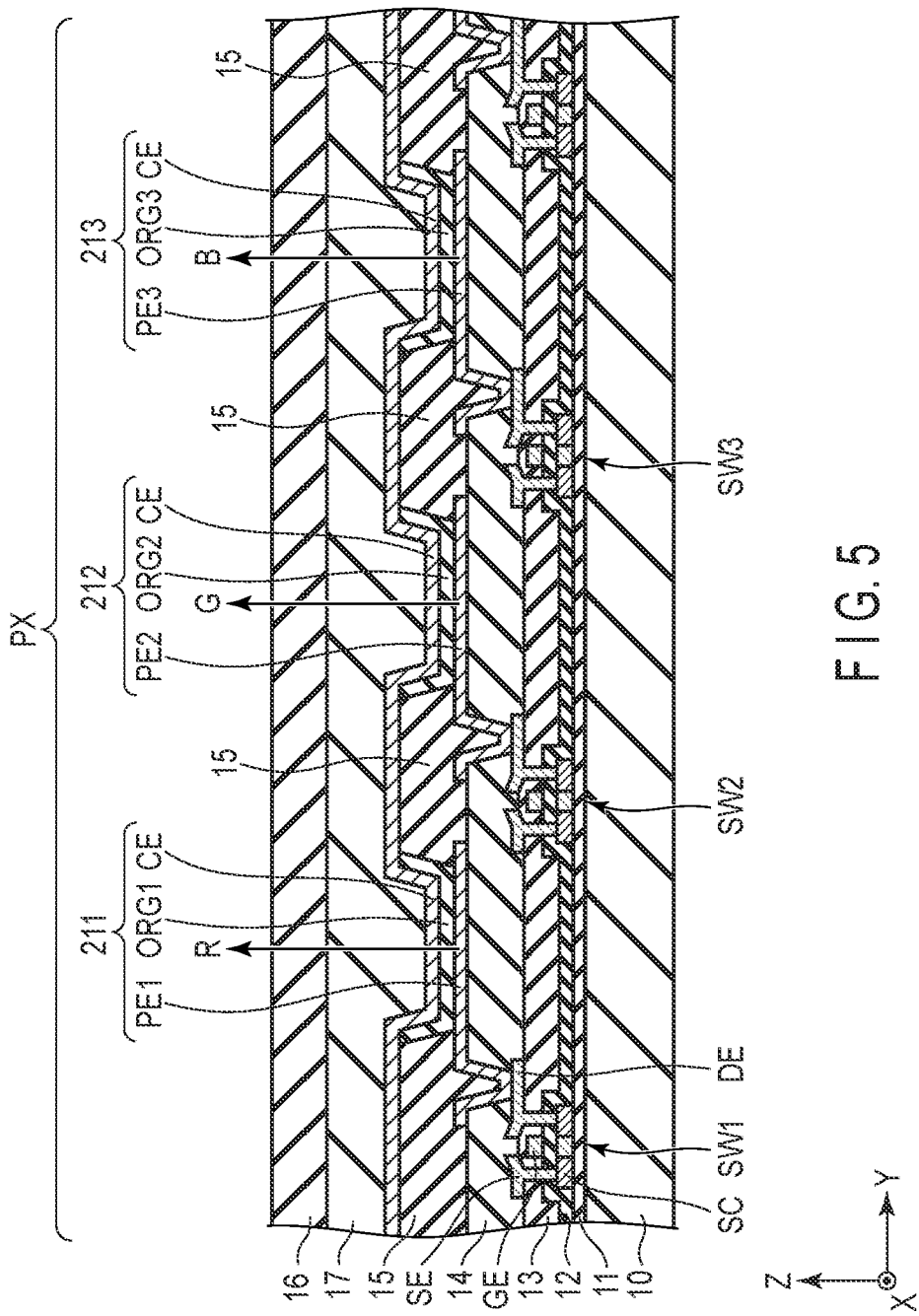
FIG. 5 is a view showing an example of a cross-section of a display panel of a pixel portion arranged in a position which does not overlap with the camera.

FIG. 5 shows an example of a cross-section of the display panel 2 at the pixel PX portion located at a position which does not overlap with the camera 6. As shown in FIG. 5, the display panel 2 includes an insulating substrate 10, first to fifth insulating films 11 to 15, switching elements SW1 to SW3, organic EL elements 211 to 213, and the like.

The switching element SW1 corresponds to the drive transistor DRT included in the pixel circuit included in the sub-pixel SPR. The switching element SW2 corresponds to the drive transistor DRT included in the pixel circuit included in the sub-pixel SPG. The switching element SW3 corresponds to the drive transistor DRT included in the pixel circuit included in the sub-pixel SPB.

In addition, the organic EL element 211 corresponds to the organic EL element 21 included in the sub-pixel SPR. The organic EL element 212 corresponds to the organic EL element 21 included in the sub-pixel SPG. The organic EL element 213 corresponds to the organic EL element 21 included in the sub-pixel SPB.

The insulating substrate 10 is formed of, for example, an organic insulating material such as polyimide. The first insulating film 11 is formed on the insulating substrate 10. The first insulating layer 11 includes a barrier layer to suppress entry of moisture and the like from the insulating substrate 10 to the organic EL elements 211 to 213. The first insulating film 11 may be omitted.

The switching elements SW1 to SW3 are formed on the first insulating film 11. A configuration of the switching element SW1 will be mainly described below.

The switching element SW1 includes a semiconductor layer SC, a gate electrode GE, a source electrode SE, and a drain electrode DE. In the example shown in FIG. 5, the source electrode SE corresponds to the second electrode of the drive transistor DRT described with reference to FIG. 4, and the drain electrode DE corresponds to the first electrode of the drive transistor DRT.

The semiconductor layer SC is formed on the first insulating film 11 and is covered with the second insulating film 12. The gate electrode GE is located on the second insulating film 12 and is covered with the third insulating film 13. The gate electrode GE is formed of, for example, a metallic material such as aluminum (Al), titanium (Ti), silver (Ag), molybdenum (Mo), tungsten (W), copper (Cu), or chromium (Cr) or an alloy formed by combining these metallic materials. The gate electrode GE may have a single-layer structure or a multilayer structure.

Each of the source electrode SE and the drain electrode DE is formed on the third insulating film 13. Each of the source electrode SE and the drain electrode DE is in contact with the semiconductor layer SC through the contact hole which penetrates the third insulating film 13 to the semiconductor layer SC. The above metallic material can be applied as the material to form the source electrode SE and the drain electrode DE. The first to third insulating films 11 to 13 are formed of an inorganic insulating material such as silicon oxide, silicon nitride, or silicon oxynitride.

The switching element SW1 is covered with the fourth insulating film 14. The fourth insulating film 14 is formed of, for example, an organic insulating material.

The configuration of the switching element SW1 has been mainly described, but the configurations of the other switching elements SW2 and SW3 are similar to the configuration of the switching element SW1.

The organic EL elements 211 to 213 are formed on the fourth insulating film 14. In the example shown in FIG. 5, the organic EL element 211 includes an organic light emitting layer ORG1 which emits red light, the organic EL element 212 includes an organic light emitting layer ORG2 which emits green light, and the organic EL element 213 includes an organic light emitting layer ORG3 which emits blue light. The organic EL elements 211 to 213 can emit red, green, and blue (light) by these organic light emitting layers ORG1 to ORG3, respectively.

A configuration of the organic EL element 211 will be mainly described below. The organic EL element 211 includes a pixel electrode PE1, a common electrode CE, and the organic light emitting layer ORG1.

The pixel electrode PE1 is provided on the fourth insulating film 14. The pixel electrode PE1 functions as, for example, an anode electrode (anode) of the organic EL element 211. The pixel electrode PE1 is in contact with the drain electrode DE of the switching element SW1 in a contact hole provided in the fourth insulating film 14, and is electrically connected to the switching element SW1. The organic light emitting layer ORG1 is formed on the pixel electrode PE1. The organic light emitting layer ORG1 may further include an electron-injection layer, a hole-injection layer, an electron-transport layer, a hole-transport layer, and the like to improve the light emission efficiency. The common electrode CE is formed on the organic light emitting layer ORG1. The common electrode CE functions as, for example, a cathode electrode (cathode) of the organic EL device 211.

The organic EL element 211 constituted as described above emits the light with the luminescence corresponding to the voltage (or the current) applied between the pixel electrode PE1 and the common electrode CE.

The configuration of the organic EL element 211 has been mainly described, but the configurations of the other organic EL elements 212 and 213 are the same as the configuration of the organic EL element 211.

The organic light emitting layers ORG1 to ORG3 are formed separately from each other to emit light of different colors.

In addition, each of the sub-pixels SPR, SPG, and SPB includes an area where the organic EL element 21 emits light (hereinafter referred to as a light emitting portion of the sub-pixel), in the area occupied by the sub-pixel in planar view (range in which the organic EL element 21 and the pixel circuit are formed) and, for example, the light emitting portion of the sub-pixel SPR in FIG. 5 is a portion sandwiched between the pixel electrode PE1 and the common electrode CE of the organic light emitting layer ORG1, which are opposed to each other. The light emitting portions of the sub-pixels SPG and SPB are the same as this light emitting portion. In the present embodiment, for example, it is assumed that the areas occupied by the sub-pixels SPR, SPG and SPB are substantially the same as each other.

The organic EL elements 211 to 213 (respective light emitting portions of the sub-pixels SPR, SPG, and SPB) are divided by the fifth insulating film (rib) 15 formed of an organic insulating material. In other words, each of the organic light emitting layers ORG1 to ORG3 is arranged in the aperture portion of the rib.

In this case, the common electrode CE is formed to be in contact with each of the organic light emitting layers ORG1 to ORG3 and with the fifth insulating film 15.

Although not shown in FIG. 5, the organic EL elements 211 to 213 may be sealed by a transparent sealing film.

The display panel 2 further includes an insulating substrate 16, and the insulating substrate 16 is bonded by a transparent adhesive 17.

In the present embodiment, images are displayed on the display panel 2 (display area DA) by urging the organic light emitting layers ORG1 to ORG3 provided in the organic EL elements 211 to 213 to emit light, and the light from the organic light emitting layers ORG1 to ORG3 is emitted from both the upper and lower surfaces of the organic light emitting layers ORG1 to ORG3.

In this case, for example, since the light emitted from the lower surfaces of the organic light-emitting layers ORG1 to ORG3 does not contribute to the display of images in the display area DA located on the upper surface sides of the organic light emitting layers ORG1 to ORG3, the luminance of the light visibly recognized in the display area DA (display surface) decreases.

Therefore, in the present embodiment, the pixel electrodes PE1 to PE3 located on the lower surface sides of the organic light emitting layers ORG1 to ORG3 are reflective electrodes formed of a metallic material having light-reflecting properties (for example, aluminum or the like). According to this, since the light emitted to the lower side from the organic light emitting layers ORG1 to ORG3 can be reflected to the upper side by the pixel electrodes PE1 to PE3 (reflective electrodes) and the light emitted to the lower side can be emitted from the display area DA, the luminance of the light visibly recognized in the display area DA can be improved.

The common electrode CE is formed of, for example, a transparent conductive material such as indium tin oxide (ITO) or indium zinc oxide (IZO).

On the other hand, as described above with reference to FIG. 2, when the camera 6 is arranged on the back surface side of the display panel 2, visible light needs to be made incident on the imaging device of the camera 6 via the display panel 2 (display device 1) in order for the camera 6 to capture images, and the visible light cannot be transmitted through the above-described pixel electrodes PE 1 to PE3 (reflective electrodes).

In addition, since, for example, the switching elements SW1 to SW3 and the like are formed in areas other than the light emitting portions (pixel electrodes PE1 to PE3) of the sub-pixels SPR, SPG, and SPB in planar view, it is also difficult to make a sufficient amount of visible light incident on the camera 6 (imaging device) through the areas.

Therefore, a configuration of making a sufficient amount of visible light incident on the imaging device by, for example, thinning out the pixels PX in the area of the display area DA, which overlap with the imaging device (camera 6) (hereinafter referred to as a comparative example of the present embodiment) is considered. In the following explanations, the area of the display area DA which overlaps with the imaging device is referred to as an overlapping area, and the area which does not overlap with the imaging device is referred to as a non-overlapping area.

Figure 6:
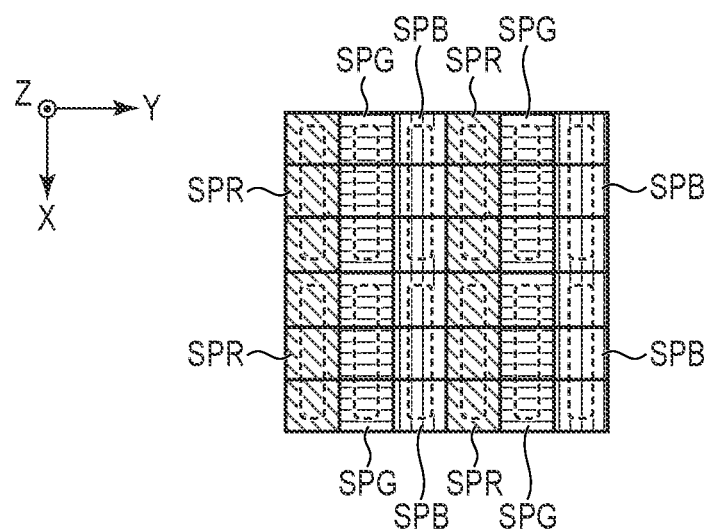
FIG. 6 is a view schematically showing pixels arranged in a non-overlapping area.

FIG. 6 schematically shows the pixels PX arranged in the non-overlapping area. In FIG. 6, four pixels PX are shown, and each of the pixels PX includes the sub-pixels SPR, SPG, and SPB. In the non-overlapping area, the areas occupied by the sub-pixels SPR, SPG, and SPB included in the pixel PX have the same shape, and the sub-pixels SPR, SPG, and SPB are arranged side by side in the order of the sub-pixels SPR, SPG, and SPB to be adjacent in the direction Y. Broken lines in the sub-pixels SPR, SPG, and SPB shown in FIG. 6 indicate the light emitting portions (aperture portions formed by the ribs) of the respective sub-pixels SPR, SPG, and SPB. The sub-pixels are shown similarly in the other FIGS. described below.

Figure 7:
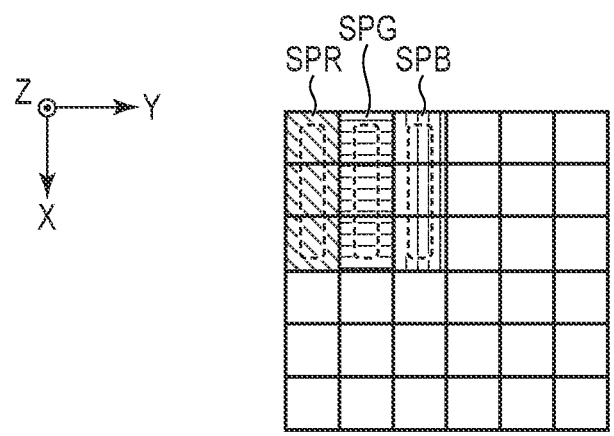
FIG. 7 is a view schematically showing pixels arranged in an overlapping area in a comparative example of the present embodiment.
Figure 8:
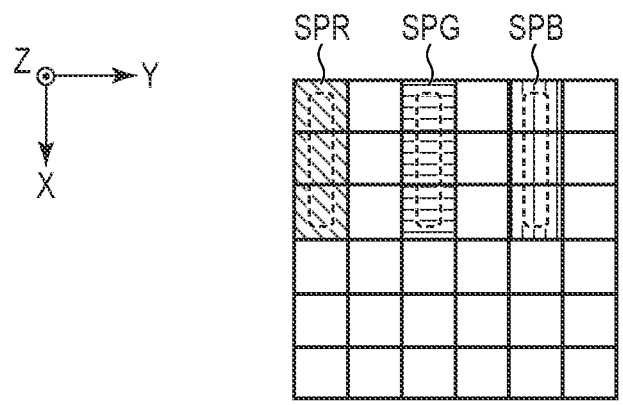
FIG. 8 is a view schematically showing an example of arrangement of sub-pixels in a first configuration of the present embodiment.

On the other hand, FIG. 7 schematically shows the pixel PX arranged in the overlapping area in the comparative example of the present embodiment. As shown in FIG. 8, by thinning out, for example, three of four pixels PX shown in FIG. 7, in the overlapping area, visible light transmitted through the area where the pixels PX are thinned out (i.e., the area where the pixel electrodes PE1 to PE3 are not arranged) is made incident on the imaging device.

In the area where the sub-pixels SPR, SPG, and SPB are not arranged in FIG. 7, the pixel electrodes PE1 to PE3 are not formed, but the organic light emitting layers ORG1 to ORG3 and the common electrode CE are formed. However, since the organic light emitting layers ORG1 to ORG3 and the common electrode CE have light transmittance, visible light can be transmitted in the area where the pixel electrodes PE1 to PE3 are not formed. Furthermore, in the area where the sub-pixels SPR, SPG, and SPB are not arranged, the above aperture portions of the ribs may not be formed.

As described above, according to the comparative example of the present embodiment, a sufficient amount of visible light can be made incident on the imaging device.

In the configuration in which the pixels PX are simply thinned out similarly to the comparative example of the present embodiment, however, each pixel PX is arranged at intervals of one pixel in the overlapping area, and a dot pattern is visibly recognized when an image is displayed (raster display) in the area where the pixels PX are thinned out (i.e., the overlapping area).

In other words, in the above-described comparative example of the present embodiment, the display quality in the overlapping area may be degraded.

Therefore, in the present embodiment, a configuration in which, for example, at least one of the sub-pixels SPR, SPG, and SPB overlapping with the imaging device in planar view is arranged at an interval different from the intervals of the sub-pixels SPR, SPG, and SPB, which do not overlap with the imaging device in planar view, to suppress the degradation in display quality in the above overlapping area, is adopted.

The arrangement of the sub-pixels SPR, SPG, and SPB (i.e., pixel PX) which overlap with the imaging device in the present embodiment will be described below in more detail.

FIG. 8 schematically shows an example of the arrangement of the sub-pixels SPR, SPG, and SPB in a first configuration of the present embodiment.

As shown in FIG. 6 described above, the sub-pixels SPR, SPG, and SPB which do not overlap with the imaging device are arranged in the order of the sub-pixels SPR, SPG, and SPB to be adjacent in the direction Y, but the sub-pixels SPR, SPG, and SPB which overlap with the imaging device as shown in FIG. 8 are arranged side by side in direction Y to be spaced by an interval of at least one sub-pixel. The sub-pixels SPR, SPG, and SPB in the first configuration of the present embodiment are arranged in the same order as the sub-pixels SPR, SPG, and SPB which do not overlap with the imaging device shown in FIG. 6.

According to the first configuration of the present embodiment, it is possible to prevent the dot pattern from being visibly recognized (i.e., to improve the roughness of display) as compared to the above-described comparative example of the present embodiment. Furthermore, in the first configuration of the present embodiment, since the sub-pixels SPR, SPG, and SPB which overlap with the imaging device are arranged in the same order as the sub-pixels SPR, SPG, and SPB which do not overlap with the imaging device, it is possible to prevent coloring expressed in the overlapping area and the non-overlapping area from being different.

Figure 9:
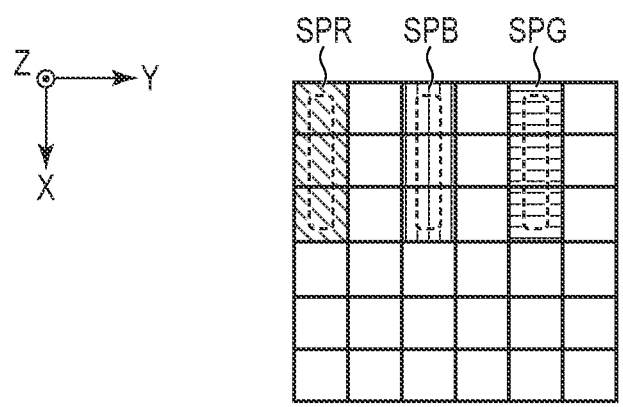
FIG. 9 is a view schematically showing an example of arrangement of sub-pixels in a second configuration of the present embodiment.

FIG. 9 schematically shows an example of the arrangement of the sub-pixels SPR, SPG, and SPB in the second configuration of the present embodiment.

The sub-pixels SPR, SPG, and SPB shown in FIG. 9 are the same as the first configuration of the present embodiment described above in that the sub-pixels are arranged side by side in the direction Y to be spaced apart with an interval of at least one sub-pixel, but the order of arrangement of the sub-pixels SPR, SPG, and SPB is different from the first configuration.

In other words, the sub-pixels SPR, SPG, and SPB in the second configuration of the present embodiment are arranged in the order different from the order of arrangement of the sub-pixels SPR, SPG, and SPB which do not overlap with the imaging device shown in FIG. 6. More specifically, the sub-pixels SPR, SPG, and SPB are arranged side by side in the order of the sub-pixels SPR, SPB, and SPG in the second direction Y, in the second configuration of the present embodiment. In other words, the second configuration of the present embodiment corresponds to the configuration in which the sub-pixels SPG and SPB in the above-described first configuration of the present embodiment are replaced.

In the second configuration of the present embodiment, it is possible to prevent the dot pattern from being visually recognized similarly to the above-described first configuration of the present embodiment.

The organic light emitting layers ORG1 to ORG3 need to be formed separately from each other as described above with reference to FIG. 6 and, for example, the separated organic light emitting layers ORG1 to ORG3 are formed for the respective colors of emitted light (i.e., organic light emitting layers ORG1 to ORG3) using fine masks or the like.

However, the positions of the sub-pixels SPG and SPB arranged in the overlapping area in the above-described first configuration of the present embodiment are different from the positions of the sub-pixels SPG and SPB arranged in the non-overlapping area shown in FIG. 7.

More specifically, the sub-pixel SPG which overlaps with the imaging device in the first configuration of the present embodiment is arranged at a position corresponding to the position where the sub-pixel SPB is arranged in the non-overlapping area. In addition, the sub-pixel SPB which overlaps with the imaging device in the first configuration of the present embodiment is arranged at a position corresponding to the position where the sub-pixel SPG is arranged in the non-overlapping area.

This means that in order to form organic light emitting layers ORG2 and ORG3 in the overlapping area, it is necessary to separately prepare a fine mask which is different from a fine mask used to form the organic light emitting layers ORG2 and ORG3 in the non-overlapping area (hereinafter referred to as a mask of the non-overlapping area). The tension applied to the fine mask used in the overlapping area is different between that applied to the fine mask used in the non-overlapping area. If the same tension as that to the fine mask used in the overlapping area is applied to the fine mask used in the non-overlapping area, the light emitting layer is not formed correctly, resulting in unevenness when the images are displayed. In other words, in the first configuration of the present embodiment, the mask used in the non-overlapping area cannot be used to form the organic light emitting layers ORG2 and ORG3 in the overlapping area.

In contrast, the positions of the sub-pixels SPG and SPB arranged in the overlapping area in the second configuration of the present embodiment correspond to the positions of the sub-pixels SPG and SPB arranged in the non-overlapping area shown in FIG. 6. For this reason, in the second configuration of the present embodiment, the mask having the same pattern as that of the mask of the non-overlapping area can be used to form the organic light emitting layers ORG1 to ORG3 in the overlapping area, thereby reducing display irregularities.

In the first and second configurations of the present embodiment, the dot pattern can be avoided from being visually recognized as described above, but the stripe pattern may be visually recognized because of the configuration in which the sub-pixels SPR, SPG, and SPB arranged in a row in the direction Y are arranged in the direction X at intervals of one pixel.

Figure 10:
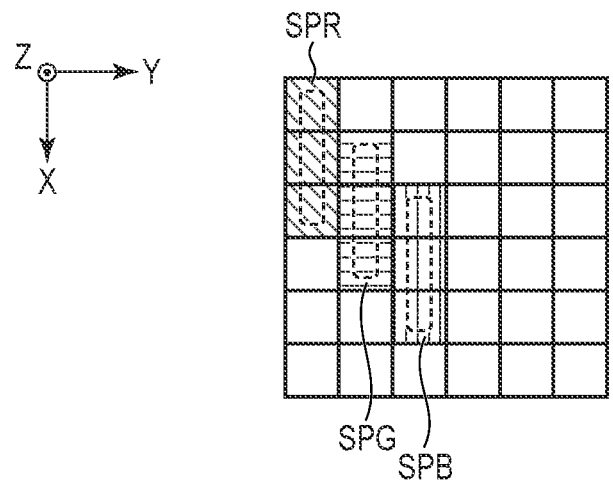
FIG. 10 is a view schematically showing another example of the arrangement of sub-pixels in the present embodiment.

For this reason, for example, as shown in FIG. 10, the position of at least one of the sub-pixels SPR, SPG, and SPB described with reference to FIG. 7 in the direction X may be different from the positions of the other sub-pixels. By shifting the sub-pixels in the X direction, the interval between the pixels adjacent in the X direction can be narrowed and the roughness of display can be improved.

Figure 11:
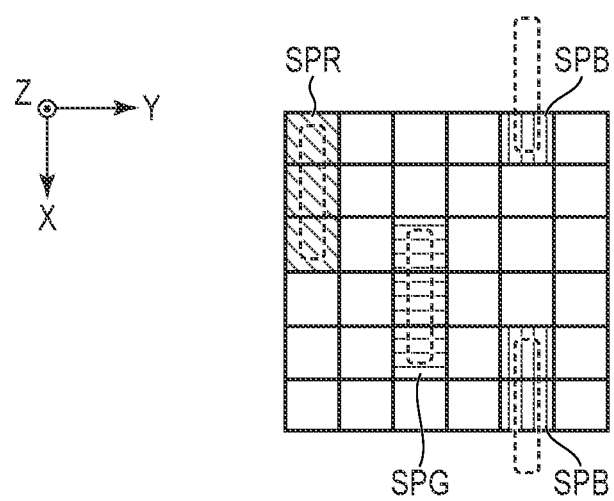
FIG. 11 is a view schematically showing another example of the arrangement of the sub-pixels in the first configuration of the present embodiment.
Figure 12:
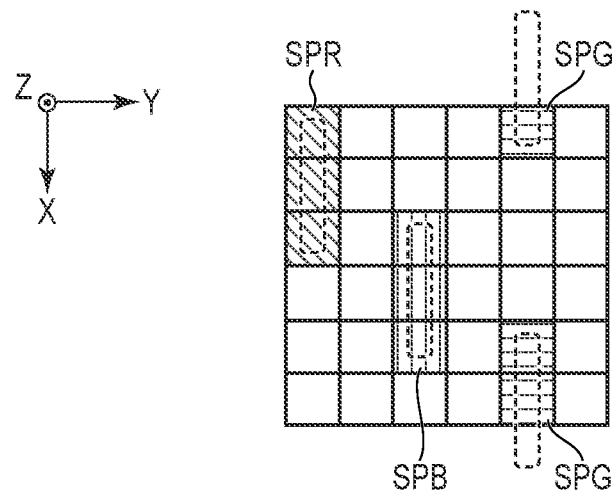
FIG. 12 is a view schematically showing another example of the arrangement of the sub-pixels in the second configuration of the present embodiment.

In addition, as shown in FIG. 11 and FIG. 12, the position of at least one of the sub-pixels SPR, SPG, and SPB overlapping with the imaging device described in the first and second configurations of the present embodiment may be made different from the positions of the other sub-pixels in the direction X.

The example shown in FIG. 11 shows the arrangement of the sub-pixels SPR, SPG, and SPB in which the sub-pixel SPG shown in FIG. 8 is shifted in the direction X and the sub-pixel SPB is further shifted in the direction X.

In contrast, the example shown in FIG. 12 shows the arrangement of the sub-pixels SPR, SPG, and SPB in which the sub-pixel SPB shown in FIG. 9 is shifted in the direction X and the sub-pixel SPG is further shifted in the direction X.

According to this configuration, it is possible to avoid the dot pattern from being visually recognized similarly to the above-described first and second configurations of the present embodiment and, furthermore, to avoid the stripe pattern from being visually recognized.

In the configuration shown in FIG. 12, the mask having the same pattern as the mask of the non-overlapping area can be used when the organic light emitting layers ORG1 to ORG3 are formed in the overlapping area, but the sub-pixels SPG and SPB are formed in the overlapping area at positions different from those in the non-overlapping area (i.e., the positions shifted in the direction X). In this case, parts of the organic light emitting layers ORG2 and ORG3 that constitute the sub-pixels SPG and SPB in the overlapping area formed with the mask of the same pattern as that of the mask in the non-overlapping area may not be properly deposited, resulting in a short circuit between the pixel electrode and the common electrode.

Figure 13:
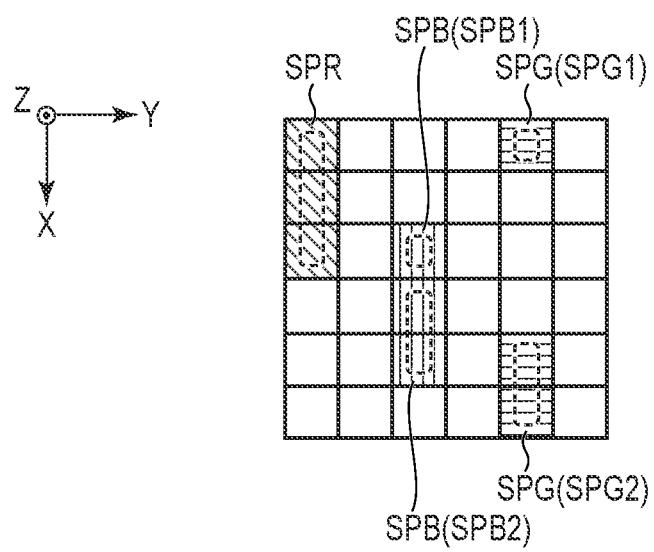
FIG. 13 is a view schematically showing an example of a configuration for dividing light emitting portions of the sub-pixels formed in the overlapping area.

In this case, as shown in FIG. 13, the light emitting portions of the sub-pixels SPR, SPG, and SPB formed in the overlapping area may be divided and formed in accordance with each of the boundaries of the sub-pixels SPR, SPG, and SPB formed in the non-overlapping area.

In the example shown in FIG. 13, since the sub-pixel SPG (organic light emitting layer ORG2) in the overlapping area is formed at a position straddling the boundary of the sub-pixels SPG formed to be adjacent in the direction X in the non-overlapping area, two light emitting portions divided at the boundary (i.e., the light emitting portion of the first portion SPG1 and the light emitting portion of the second portion SPG2, in the sub-pixel SPG) are formed for one sub-pixel SPG. In this case, the pixel electrode PE2 is formed such that the first portion SPG1 and the second portion SPG2 of the sub-pixel SPG include different light emitting portions, respectively.

In addition, since the sub-pixel SPB (organic light emitting layer ORG3) in the overlapping area is formed at a position straddling the boundary of the sub-pixels SPB formed to be adjacent in the direction X in the non-overlapping area, two light emitting portions divided at the boundary (i.e., the light emitting portion of the first portion SPB1 and the light emitting portion of the second portion SPB2, in the sub-pixel SPB) are formed for one sub-pixel SPB. In this case, the pixel electrode PE3 is formed such that the first portion SPB1 and the second portion SPB2 of the sub-pixel SPB include different light emitting portions, respectively.

Figure 14:
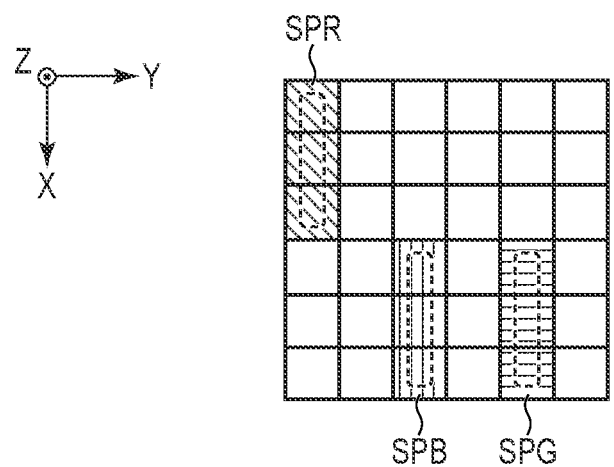
FIG. 14 is a view schematically showing yet another example of the arrangement of the sub-pixels in the second configuration of the present embodiment.

If forming separate light emitting portions in one sub-pixel is avoided, for example, the configuration shown in FIG. 14 can be formed. In the configuration shown in FIG. 14, the sub-pixels SPG and SPB shown in FIG. 9 are shifted in the direction X so as not to straddle the boundary between the sub-pixels SPG and SPB formed in the non-overlapping area.

Figure 15:
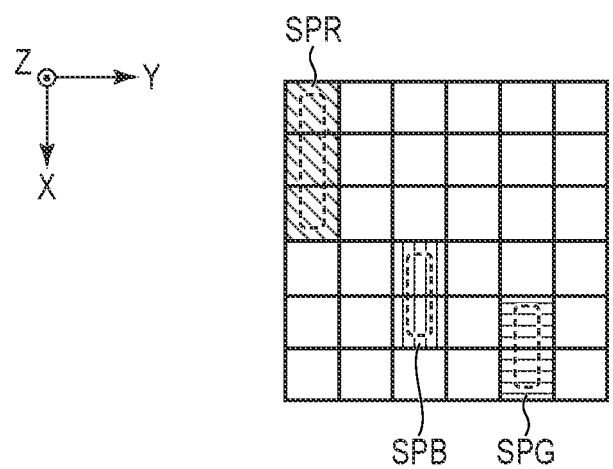
FIG. 15 is a view schematically showing yet another example of the arrangement of the sub-pixels in the second configuration of the present embodiment.

Furthermore, as shown in FIG. 15, for example, the size of the area in planar view occupied by (the light emitting portions of) the sub-pixels SPG and SPB (hereinafter simply referred to as the area of the sub-pixels SPG and SPB) may be smaller than the size of the area in planar view occupied by (the light emitting portion of) the sub-pixel SPR (hereinafter simply referred to as the area of the sub-pixel SPR). According to such a configuration, the amount of visible light made incident on the imaging device can be increased.

In FIG. 15, the position of the sub-pixel SPG in the direction X is different from the position of the sub-pixel SPB in the direction X, but the position of the sub-pixel SPG in the direction X may correspond to the position of the sub-pixel SPB in the direction X.

Alternatively, the configuration shown in FIG. 15 is an example, and the sub-pixels SPR, SPG, and SPB may be formed such that the size of the area of at least one of the sub-pixels SPR, SPG, and SPB is smaller than the size of the area of the other sub-pixels. The size of the area of each of the sub-pixels SPR, SPG and SPB may be determined in accordance with, for example, the color to be displayed by the sub-pixel, the position of the sub-pixel, and the like.

Alternatively, the above-described configuration in which the size of the area of at least one of the sub-pixels SPR, SPG, and SPB is smaller than the size of the area of the other sub-pixels may be applied to the above sub-pixels SPR, SPG, and SPB shown in FIG. 8 to FIG. 13.

As described above, in the present embodiment, the degradation of display quality in the display area DA (overlapping area) which overlaps with the imaging device can be suppressed by the configuration in which at least one of the sub-pixels SPR, SPG, and SPB (first to third pixels) overlapping with the imaging device in planar view is arranged at the interval different from the intervals of the sub-pixels SPR, SPG, and SPB which do not overlap with the imaging device in planar view.

More specifically, in the present embodiment, by arranging each of the sub-pixel SPR, SPG, and SPB in the overlapping area having the same size as the size of the area where four pixels PX are arranged in the non-overlapping area, sufficient visible light can be made incident on the imaging device similarly to the above-described comparative example of the present embodiment shown in FIG. 7, and it is possible to avoid the dot pattern described with reference to FIG. 7 from being visually recognized by arranging the sub-pixels SPR, SPG, and SPB in the overlapping area at intervals different from those in the non-overlapping area.

In the present embodiment, an example in which each of the sub-pixel SPR, SPG, and SPB is arranged in the overlapping area having the same size as the size of the area where four pixels PX are arranged in the non-overlapping area has been described, but the number of sub-pixels SPR, SPG, and SPB arranged in the overlapping area may be changed as appropriate if a sufficient amount of visible light is made incident on the imaging device.

In addition, in the present embodiment, it has been described that the pixel PX includes three sub-pixels SPR, SPG, and SPB, but the pixel PX may be configured to include, for example, four sub-pixels SPR, SPG, SPB, and SPW. The sub-pixel SW is a sub-pixel which displays (outputs) light corresponding to a white wavelength range (light of a white component). Even in such a configuration, at least one of the four sub-pixels SPR, SPG, SPB, and SPW that overlap with the imaging device in planar view may be arranged at intervals different from those of the sub-pixels SPR, SPG, SPB, and SPW which do not overlap with the imaging device in planar view.

Furthermore, it has been described that the camera 6 is a visible light camera in the present embodiment, but the camera 6 may be any other camera (imaging device) such as an infrared camera which captures images based on infrared light (infrared rays) made incident on the imaging device.

Second Embodiment

Next, a second embodiment will be described. In the present embodiment, detailed descriptions of the same portions as those of the above-described first embodiment will be omitted, and the portions different from those of the first embodiment will be mainly described. In addition, FIG. 1 to FIG. 5, and the like will be used as appropriate when the configuration of the electronic apparatus and the display device in the present embodiment is described.

In the above-described first embodiment, the case in which the pixel PX which does not overlap with the imaging device includes the sub-pixels SPR, SPG, and SPB adjacent in order in the direction Y as shown in FIG. 7 has been described, but the present embodiment is different from the first embodiment in the configuration of the pixel PX (size, shape and arrangement of the sub-pixels SPR, SPG, and SPB in planar view).

Figure 16:
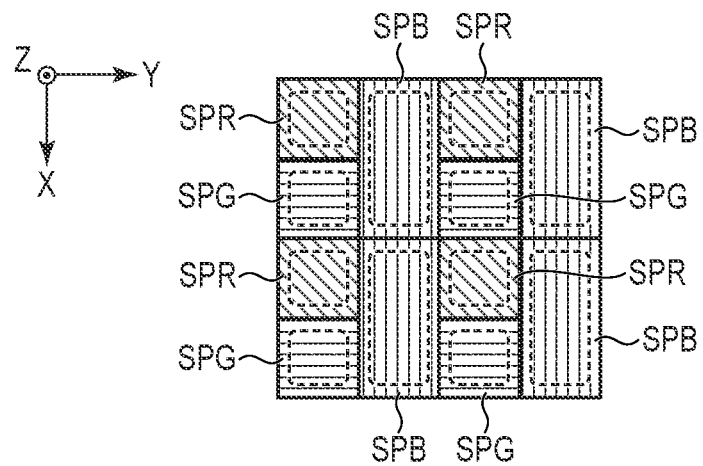
FIG. 16 is a view schematically showing pixels arranged in a non-overlapping area in a second embodiment.

FIG. 16 schematically shows the pixel PX arranged in the non-overlapping area in the present embodiment. In FIG. 16, four pixels PX are shown, and each of the pixels PX includes sub-pixels SPR, SPG, and SPB. In addition, the sub-pixels SPR, SPG, and SPB included in the pixel PX arranged in the non-overlapping area are arranged such that the sub-pixels SPR and SPG are adjacent in the direction X, the sub-pixels SPR and SPB are adjacent to each other in the direction Y, and the sub-pixels SPG and SPB are adjacent in the direction Y. Broken lines in the sub-pixels SPR, SPG, and SPB shown in FIG. 16 indicate the light emitting portions of the respective sub-pixels SPR, SPG, and SPB. The sub-pixels are shown similarly in the other figures described below.

Figure 17:
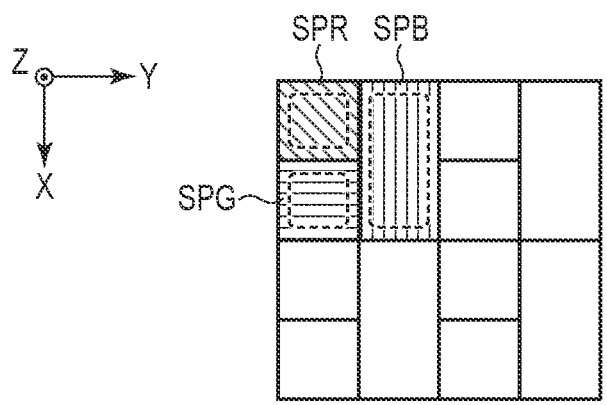
FIG. 17 is a view schematically showing pixels arranged in an overlapping area in a comparative example of the embodiment.

On the other hand, FIG. 17 schematically shows the pixel PX arranged in the overlapping area in the comparative example of the present embodiment. As shown in FIG. 17, by thinning out, for example, three of four pixels PX shown in FIG. 16, in the overlapping area, visible light transmitted through the area where the pixels PX are thinned out (i.e., the area where the pixel electrodes PE1 to PE3 are not arranged) is made incident on the imaging device.

As described above, according to the comparative example of the present embodiment, a sufficient amount of visible light can be made incident on the imaging device.

In the configuration in which the pixels PX are simply thinned out similarly to the comparative example of the present embodiment, however, each pixel PX is arranged at intervals of one pixel in the overlapping area, and a dot pattern is visibly recognized when an image is displayed (raster display) in the area where the pixels PX are thinned out (i.e., the overlapping area).

In other words, in the above-described comparative example of the present embodiment, the display quality in the overlapping area may be degraded.

Therefore, in the present embodiment, a configuration in which the sub-pixels SPR, SPG, and SPB in the overlapping area are arranged such that at least the sub-pixels SPR and SPG, the sub-pixels SPR and SPB, or the sub-pixels SPG and SPB are not adjacent, to suppress the degradation in display quality in the above overlapping area, is adopted.

Figure 18:
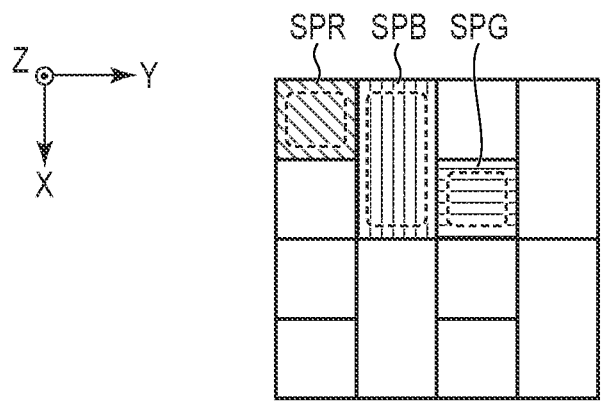
FIG. 18 is a view schematically showing an example of arrangement of the sub-pixels in the present embodiment.
Figure 19:
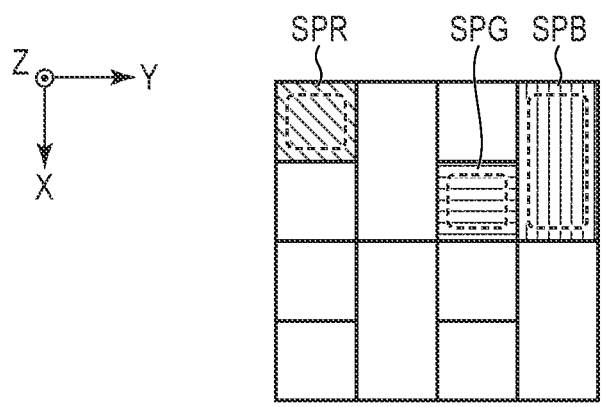
FIG. 19 is a view schematically showing another example of the arrangement of the sub-pixels in the present embodiment.

More specifically, FIG. 18 and FIG. 19 show the arrangement of the sub-pixels SPR, SPG, and SPB arranged such that the sub-pixels SPR and SPG are not adjacent to each other.

According to the configuration shown in FIG. 18 and FIG. 19, it is possible to prevent the dot pattern from being visibly recognized (i.e., to improve the roughness of display) as compared to the above-described comparative example of the present embodiment.

In contrast, FIG. 20 shows sub-pixels SPR, SPG, and SPB arranged such that the sub-pixels SPR, SPG, and SPB are not adjacent.

The stripe pattern described with reference to FIG. 8 and FIG. 9 may be visually recognized in the configuration shown in FIG. 18 and FIG. 19, but it is possible to avoid the dot pattern from being visually recognized and avoid the stripe pattern from being visually recognized, in the configuration shown in FIG. 20.

The configuration shown in FIG. 18 to FIG. 20 is an example and, in the present embodiment, the sub-pixels SPR and SPG and SPB may be arranged such that at least the sub-pixels SPR and SPG, the sub-pixels SPR and SPB, or the sub-pixels SPG and SPB are not adjacent to each other in the overlapping area (i.e., the sub-pixels may be arranged with intervals different from those of the sub-pixels SPR, SPG, and SPB shown in FIG. 17).

As described above, in the present embodiment, even in the configuration in which the sub-pixels SPR, SPG, and SPB included in the pixel PX are arranged such that the sub-pixels SPR and SPG are adjacent to each other in the direction X, the sub-pixels SPR and SPB are adjacent to each other in the direction Y, and the sub-pixels SPG and SPB are adjacent to each other in the direction Y, the degradation of display quality in the display area DA (overlapping area) overlapping with the imaging device can be suppressed by arranging the sub-pixels SPR, SPG, and SPB in the overlapping area as shown in, for example, FIG. 18 to FIG. 20 (arranging the sub-pixels such that at least two of the sub-pixels SPR, SPG and SPB are not adjacent).

All electronic apparatuses and display devices, which are implementable with arbitrary changes in design by a person of ordinary skill in the art based on the electronic apparatuses and display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. An electronic apparatus comprising:
   a display panel on which a first pixel including a first light emitting element which emits light of a first color, a second pixel including a second light emitting element which emits light of a second color, and a third pixel including a third light emitting element which emits light of a third color are arranged; and
   an imaging device receiving light through the display panel, wherein
   at least one of the first to third pixels which overlap with the imaging device in planar view is arranged with an interval different from an interval of the first to third pixels which do not overlap with the imaging device in planar view.

2. The electronic apparatus of claim 1, wherein
   the first to third pixels which do not overlap with the imaging device in planar view are arranged side by side in order of the first to third pixels to be adjacent to each other in a first direction, and
   the first to third pixels which overlap with the imaging device in planar view are arranged side by side in a first direction to be spaced apart with an interval of at least one pixel.

3. The electronic apparatus of claim 2, wherein
   the first to third pixels which overlap with the imaging device in planar view are arranged in the same order as an order of the first to third pixels which do not overlap with the imaging device in planar view.

4. The electronic apparatus of claim 2, wherein
   the first to third pixels which overlap with the imaging device in planar view are arranged in an order different from an order of the first to third pixels which do not overlap with the imaging device in planar view.

5. The electronic apparatus of claim 2, wherein
   a position of at least one of the first to third pixels which overlap with the imaging device in planar view is different from positions of the other pixels of the first to third pixels in a second direction which intersects the first direction.

6. The electronic apparatus of claim 1, wherein
   a size of an area in planar view occupied by at least one of the first to third pixels which overlap with the imaging device in planar view is smaller than a size of an area in planar view occupied by the other pixels of the first to third pixels.

7. The electronic apparatus of claim 1, wherein
   the first to third pixels which do not overlap with the imaging device in planar view are arranged such that the first and second pixels are adjacent to each other in a second direction, the first and third pixels are adjacent to each other in a first direction intersecting the second direction, and the second and third pixels are adjacent to each other in the first direction, and
   the first to third pixels which overlap with the imaging device in planar view are arranged such that at least the first and second pixels, the first and third pixels, or the second and third pixels are not adjacent to each other.

8. The electronic apparatus of claim 1, wherein
   the first to third pixels which overlap with the imaging device in planar view are arranged side by side in order of the first to third pixels to be adjacent in a first direction, and a position of at least one of the first to third pixels is different from positions of the other pixels of the first to third pixels in a second direction which intersects the first direction.

9. A display device comprising:
a display panel on which a first pixel including a first light emitting element which emits light of a first color, a second pixel including a second light emitting element which emits light of a second color, and a third pixel including a third light emitting element which emits light of a third color are arranged; and
a drive circuit driving the display panel, wherein
at least one of the first to third pixels which overlap with an imaging device receiving light through the display panel, in planar view, is arranged with an interval different from an interval of the first to third pixels which do not overlap with the imaging device in planar view.

* * * * *